(12) United States Patent
Feichtinger et al.

(10) Patent No.: US 10,014,459 B2
(45) Date of Patent: Jul. 3, 2018

(54) LIGHT-EMITTING DIODE DEVICE

(71) Applicant: EPCOS AG, Munich (DE)

(72) Inventors: Thomas Feichtinger, Graz (AT);
Oliver Dernovsek, Lieboch (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 15/508,361

(22) PCT Filed: Aug. 5, 2015

(86) PCT No.: PCT/EP2015/068074
§ 371 (c)(1),
(2) Date: Mar. 2, 2017

(87) PCT Pub. No.: WO2016/034359
PCT Pub. Date: Mar. 10, 2016

(65) Prior Publication Data
US 2017/0309802 A1    Oct. 26, 2017

(30) Foreign Application Priority Data
Sep. 3, 2014    (DE) .................. 10 2014 112 673

(51) Int. Cl.
*H01L 33/62*     (2010.01)
*H01L 25/075*    (2006.01)
*H01L 25/16*     (2006.01)
*H01L 23/34*     (2006.01)
*H01L 23/60*     (2006.01)
(Continued)

(52) U.S. Cl.
CPC .............. *H01L 33/62* (2013.01); *H01L 23/34* (2013.01); *H01L 23/60* (2013.01); *H01L 25/0753* (2013.01); *H01L 25/167* (2013.01); *H01L 21/0254* (2013.01); *H01L 33/486* (2013.01)

(58) Field of Classification Search
CPC ....... H01L 33/62; H01L 25/167; H01L 23/34; H01L 23/60; H01L 25/0753; H01L 2201/10121; H05K 1/0204
USPC ...... 257/88, 100, 105, 787, 791; 438/22, 24, 438/46, 47
See application file for complete search history.

(56) References Cited

U.S. PATENT DOCUMENTS 6,936,855 B1 *    8/2005   Harrah ................. F21K 9/00
                                                        257/59
7,273,987 B2 *    9/2007   Becker ................ H05K 1/0204
                                                        174/252
(Continued)

FOREIGN PATENT DOCUMENTS

DE           10026460 A1      11/2001
DE         102011017790       10/2012
(Continued)

OTHER PUBLICATIONS

Machine translation of German Patent DE 10026460 Kram Angelo date Nov. 29, 2001.*

(Continued)

*Primary Examiner* — Thinh T Nguyen
(74) *Attorney, Agent, or Firm* — DLA Piper LLP (US)

(57) ABSTRACT

A light-emitting diode device is specified, comprising at least one carrier and a light-emitting diode arranged thereon. The carrier comprises a plurality of polymer layers arranged one above another. At least one polymer layer has a cutout, in which an electrical component is embedded.

15 Claims, 2 Drawing Sheets

Figure 1:
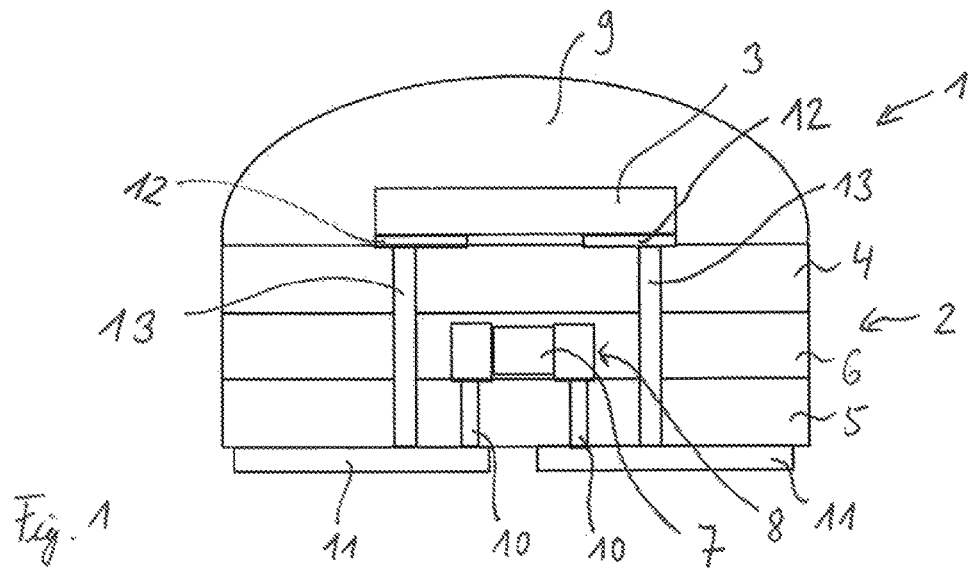

(51) Int. Cl.
*H01L 33/48* (2010.01)
*H01L 21/02* (2006.01)

(56) References Cited

U.S. PATENT DOCUMENTS

| | | | | |
|---|---|---|---|---|
| 2003/0179548 A1* | 9/2003 | Becker | ............... | H05K 1/0204 |
| | | | | 361/704 |
| 2011/0057209 A1* | 3/2011 | Kim | ............... | H01L 25/167 |
| | | | | 257/88 |
| 2014/0145633 A1* | 5/2014 | Seo | ............... | H01L 33/486 |
| | | | | 315/200 R |
| 2015/0243865 A1* | 8/2015 | Feichtinger | ............... | H01L 33/642 |
| | | | | 257/88 |

FOREIGN PATENT DOCUMENTS

| | | |
|---|---|---|
| DE | 102012108107 A1 | 3/2014 |
| JP | H05-299700 | 11/1993 |
| JP | 2003-216052 | 7/2003 |
| JP | 2008-251618 | 10/2008 |
| JP | 2009-231634 | 10/2009 |
| JP | 2013-122951 | 6/2013 |
| WO | WO 2012/145237 A1 | 4/2012 |

OTHER PUBLICATIONS

AT&S, Mark Beesley, *3D Component Packaging in Organic Substrate*, Mark Beesley, GSF 2012, Shanghai (26 pgs.).

\* cited by examiner

LIGHT-EMITTING DIODE DEVICE

RELATED APPLICATIONS/PRIORITY CLAIMS

This application is a 371 U.S. national stage filing of (and claims the benefit and priority to under 35 U.S.C. 119, 120) to PCT/EP2015/068074, filed on Aug. 5, 2015, that in turn claims priority under 35 USC 119 and 120 to DE Application No. 102014112673.4 dated Sep. 3, 2014, the entirety of all of which are incorporated herein by reference.

FIELD OF THE DISCLOSURE

A light-emitting diode device is specified which comprises at least one carrier and a light-emitting diode arranged on the carrier.

SUMMARY

In the design of systems comprising light-emitting diodes (LEDs), luminous efficiency, lifetime and thermal management are becoming ever more important. Besides functional challenges, there are also thermomechanical and geometrical problems to solve. LEDs are sensitive to overtemperatures, for example temperatures above 135° C. 150° C., and electrostatic discharges, for example voltages above 100 V. Especially in mobile applications, for example for an integrated LED camera flash in smartphones or digital cameras, the LED and discrete protective components are intended to have the smallest possible structural height and to occupy as little space as possible. A further important requirement of the housing solution is that the shading of the LED by other components, for example protective components, should be as little as possible.

The German patent application DE 102012108107 A1 discloses a light-emitting diode device.

It is an object of the present invention to specify an improved light-emitting diode device.

In accordance with a first aspect of the present invention, a light-emitting diode device is specified. The light-emitting diode device comprises at least one carrier and at least one light-emitting diode arranged on the carrier, in particular in the form of a light-emitting diode chip. The carrier comprises a plurality of polymer layers arranged one above another. An electrical component is embedded in at least one polymer layer. By way of example, the polymer layer has a cutout, in which the component is embedded. In this case, the electrical component can be completely or else only partly embedded in the polymer layer.

In one embodiment, the carrier comprises a topmost, a bottommost and at least one inner polymer layer arranged therebetween, wherein the electrical component is embedded at least in the inner polymer layer. By way of example, at least one through-connection which leads through at least one polymer layer is provided for electrically contacting the electrical component.

The LED is preferably arranged on the topmost polymer layer. By way of example, upper connection contacts are provided on the topmost polymer layer, the LED being fixed and/or electrically connected to said connection contacts. By way of example, lower connection contacts for further contacting of the LED are provided at the underside of the bottommost polymer layer. By way of example, at least one through-connection leads through the carrier in order to electrically connect the upper connection contacts to the lower connection contacts. The LED can be at least partly recessed in a cavity in the carrier, in particular in a cavity at a top side of the carrier.

It is also possible for a plurality of inner polymer layers to be arranged between the topmost and bottommost polymer layers. The electrical component can be completely or else only partly embedded in one or a plurality of the inner polymer layers. In one embodiment, the component is embedded neither in the topmost nor in the bottommost polymer layer. In particular, the component is also not partly embedded in the topmost or bottommost polymer layer. By way of example, however, through-connections lead through the topmost and/or bottommost polymer layer.

An arrangement of the component in one or a plurality of inner polymer layers, in particular in the core of the carrier, allows a particularly good reduction of thermal stresses. The lifetime of the device can be increased in this way.

In one embodiment, the component is arranged completely within the carrier. In particular, the component is surrounded by the polymer material of the carrier on all sides. However, this also includes the case in which through-connections lead from the component through the polymer material.

In one embodiment, the one or the plurality of polymer layers in which the component is embedded has/have different material properties than at least one other polymer layer of the carrier. By way of example, this involves an inner polymer layer which differs in its material properties from the topmost and/or bottommost polymer layer of the carrier.

By way of example, the polymer layers differ from one another in their mechanical strength. In particular, the polymer layer in which the component is embedded can have a lower mechanical strength than another polymer layer of the carrier. In an alternative embodiment, the polymer layer in which the component is embedded has a higher strength than another polymer layer of the carrier. The respective strengths can be chosen depending on the desired stiffness and/or bendability of the carrier.

In one embodiment, the electrical component is designed for protection against electrostatic discharges (ESD protection). By way of example, the component is designed as a varistor, as a silicon semiconductor protective diode or as a polymer component.

In a further embodiment, the electrical component is designed as a thermal sensor, as overcurrent protection, as a ceramic multilayer capacitor, as an inductance and/or as a resistance. In a further embodiment, the electrical component is designed as a driver chip.

It is also possible for a plurality of electrical components, in particular a combination of different components, to be embedded in the carrier. In one embodiment, all embedded electrical components are embedded in one or a plurality of inner polymer layers. By way of example, all components are embedded in the same one or a plurality of polymer layers.

In one embodiment, the electrical component is arranged in a centered fashion with respect to the LED in a lateral direction. In particular, the electrical component is situated directly beneath the LED in a plan view of the LED. This enables, for example, a particularly space saving arrangement of the component. By way of example, the component is arranged as a temperature sensor. A particularly reliable temperature detection at the location of the LED is possible in the case of an arrangement in a centered fashion with respect to the LED. The thermal linking to the LED can be improved with a thermal via, for example.

In one embodiment, the electrical component is arranged in a centered fashion in the carrier with respect to a stacking direction of the polymer layers. In particular, the component is arranged in the core of the carrier. By way of example, a similar or the same amount of polymer layers are situated above and below the component. The thermal management can be optimized by means of such an arrangement. In particular, thermal stresses can be compensated for particularly well.

The light-emitting diode device can also comprise a plurality of LEDs arranged on the carrier. Each LED can be assigned one or a plurality of electrical components embedded in the carrier. By way of example, each LED is assigned an ESD protective component and/or a temperature sensor. By way of example, at least below each LED a component, in particular a component assigned to the LED, is embedded in the carrier.

In one embodiment, the light-emitting diode is arranged directly on the carrier comprising the polymer layers. In another embodiment, the light-emitting diode device comprises a further carrier, on which the light-emitting diode is arranged. The further carrier is arranged on the carrier comprising the polymer layers. By way of example, the further carrier is a ceramic carrier.

BRIEF DESCRIPTIONS OF THE DRAWINGS

The subjects described here are explained in greater detail below on the basis of schematic exemplary embodiments that are not true to scale.

In the figures:

FIGS. 1 to 5 show, in schematic sectional views, a plurality of exemplary embodiments of light-emitting diode devices comprising at least one carrier with at least one LED arranged thereon.

DETAILED DESCRIPTION OF ONE OR MORE EMBODIMENTS

Preferably, in the following figures, identical reference signs refer to functionally or structurally corresponding parts of the different embodiments.

FIG. 1 shows a light-emitting diode device 1 comprising a carrier 2 for a light-emitting diode (LED) 3. The LED 3 is designed in the form of a light-emitting diode chip and is arranged on a top side of the carrier 2. In one embodiment, the LED 3 can also be partly recessed in a cavity in the carrier 2.

The carrier 2 comprises a plurality of laminated polymer layers 4, 5, 6 arranged one above another. By way of example, the polymer layers 4, 5, 6 comprise an epoxy material. In particular, the carrier 2 comprises a topmost polymer layer 4, a bottommost polymer layer 5 and at least one inner polymer layer 6 arranged therebetween. The carrier 2 can also comprise a plurality of inner polymer layers 6.

An electrical component 7 is embedded in the inner polymer layer 6. In particular, the inner polymer layer 6 has a cutout 8, in which the component 7 is arranged. Consequently, the component 7 is integrated in the carrier 2. By way of example, the component 7 is arranged directly below the LED 3. This enables a particularly space saving arrangement.

In this case, it can be advantageous if the electrical component 7 is arranged in a centered fashion in the carrier 2. By way of example, the number of polymer layers 4, 5 situated above the polymer layer 6 in which the component 7 is embedded is exactly the same as or similar to the number of polymer layers 4, 5 situated below said polymer layer 6. In this case, the component 7 is arranged in a centered fashion with respect to a stacking direction of the polymer layers 4, 5, 6. As an alternative or in addition thereto, the component 7 can also be arranged in a centered fashion in a lateral direction, for example with respect to the LED 3. In particular, the component 7 can be arranged in a centered fashion below the LED 3. In the case of an arrangement which is centered in this way, stresses can be particularly uniformly distributed and compensated for.

In one embodiment, the electrical component 7 is designed as a protective component, for example for protection against electrostatic discharges (ESD), overcurrents and/or elevated operating temperatures. By way of example, the ESD protective component is designed as a varistor, in particular as a multilayer varistor, as a silicon semiconductor protective diode, in particular as a TVS diode, or as a polymer component. Alternatively, the electrical component 7 is designed for example as a thermal sensor, in particular as an NTC sensor, as overcurrent protection, in particular as PTC overcurrent protection, as a ceramic multilayer capacitor, in particular as an MLCC component, as an inductance and/or as a resistance. Alternatively, the component 7 is designed as a driver chip. Preferably, the component 7 is electrically interconnected with the LED 3. It is also possible for a plurality of electrical components 7, for example at least one ESD protective component and a temperature sensor, to be integrated in the carrier 2.

Preferably, the component 7 is of ultra-thin design. By way of example, it has a thickness of 0.3 mm or less.

In one embodiment, the mechanical strength of the polymer layer 6 in which the component 7 is embedded is lower than the mechanical strength of at least one other of the polymer layers 4, 5. By way of example, the inner polymer layer 6 is more easily mechanically deformable than the topmost and bottommost polymer layers 4, 5. In this way, by way of example, it is possible to compensate for thermal stresses in the core of the carrier 2.

The electrical component 7 is electrically contacted by means of through-connections 10. The through-connections 10 lead through the bottommost layer 5 and are in each case connected to a planar connection contact 11 arranged on an underside of the carrier 2. The LED 3 is arranged on upper connection contacts 12 arranged on a top side of the carrier 2. The upper connection contacts 12 are connected to further through-connections 13 which lead through the entire carrier 2 and provide an electrical connection to the connection contacts 11 at the underside 2 of the carrier. The electrical component 7 and the through-connections 10 connected thereto are arranged, in the sectional view, within a space that is laterally delimited by the further through-connections 13.

The LED 3 is enclosed by a protective coating 9. The protective coating 9 acts as a lens, for example. The protective coating 9 comprises, for example, silicone and optionally a phosphor layer.

In order to produce the light-emitting diode device 1, by way of example, a plurality of polymer layers 4, 5, 6 are provided, wherein at least on polymer layer 6 has a cutout 8. The polymer layers 4, 5, 6 are arranged one above another, wherein an electrical component 7 is arranged in the cutout 8 in this case. The stack of polymer layers 4, 5, 6 containing the embedded component 7 is pressed to form a laminate.

In order to form the through-connections 10, 13, by way of example, after the pressing, holes are introduced, e.g. by means of a laser, into the polymer layers 4, 5, 6. The holes are filled with an electrically conductive material, for example in an electrolytic method, or in an electroless electrochemical method. By way of example, the holes are filled with copper. The connection contacts 10, 12 are subsequently formed.

The LED 3 is subsequently placed onto the upper connection contacts 12 and fixed for example by bonding or soldering. The LED 3 is provided with the protective coating 9.

Figure 2:
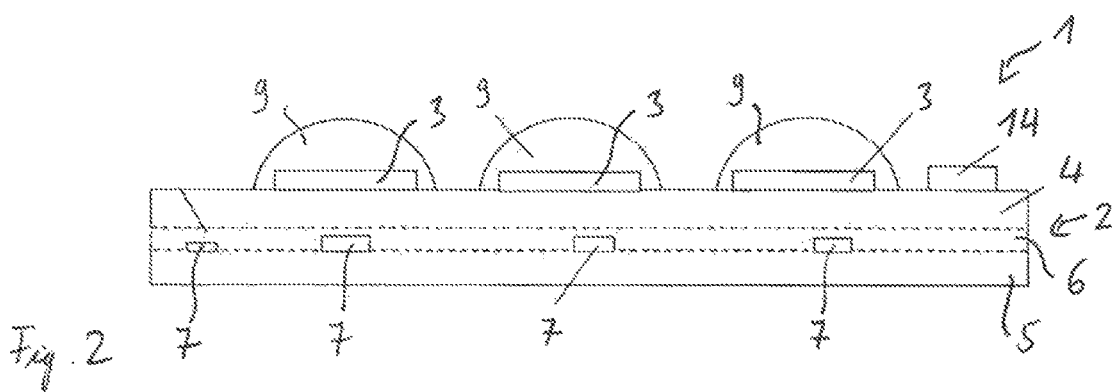

FIG. 2 shows a further embodiment of a light-emitting diode device 1, wherein a plurality of LEDs 3 with respective protective coatings 9 are arranged on a common carrier 2 comprising laminated polymer layers 4, 5, 6.

A plurality of electrical components 7 are embedded in the carrier 2. By way of example, each LED 3 is assigned at least one component 7. The respectively assigned component 7, for example in the form of an ESD protective component, can be arranged directly below the assigned LED 3.

Moreover, a further electrical component 14 is arranged on the carrier 2. The further component 14 is not embedded in the carrier 2. The further component 14 can alternatively be partly or completely recessed in a recess in the carrier 2. By way of example, the further component 14 is arranged on a top side of the carrier 2, on which the LEDs 3 are also arranged.

By way of example, the further electrical component 14 is designed as a thermal sensor. In particular, a thermistor element, for example an NTC or a PTC thermistor element, can be involved.

The light-emitting diode device 1 can otherwise be designed as described with respect to FIG. 1.

Figure 3:
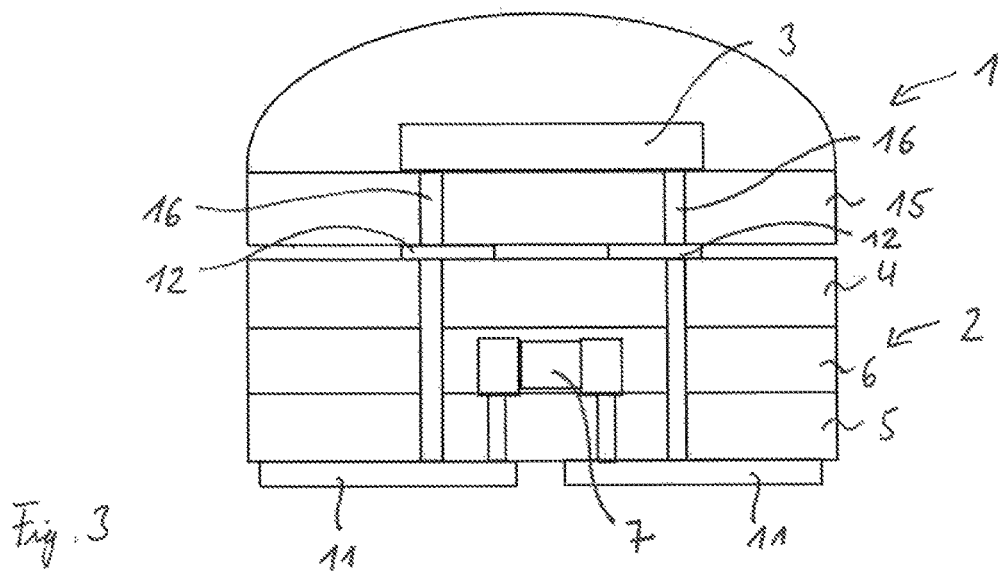

FIG. 3 shows a further embodiment of a light-emitting diode device 1, wherein here a further carrier 15 is provided, on which the LED 3 is arranged. The further carrier 15 comprises a ceramic main body, for example. The ceramic main body can be of multilayered design.

The further carrier 15 is arranged on the carrier 2 comprising the polymer layers 4, 5, 6. In particular, the further carrier 15 is fixed to upper connection contacts 12 of the carrier 2 and is electrically connected thereto. The LED 3 is connected to through-connections 16 which lead through the further carrier 15 and are electrically connected to the connection contacts 12.

The light-emitting diode device 1 can otherwise be designed as described with respect to FIGS. 1 and 2.

An arrangement in which one or a plurality of LEDs and/or other components are arranged on a single carrier (FIGS. 1 and 2) is designated as a level 1 system. If one or a plurality of level 1 systems are in turn mounted on a common carrier, this is referred to as a level 2 system, as shown in FIG. 3. A level 2 system can contain, in particular, a plurality of level 1 modules.

Figure 4:
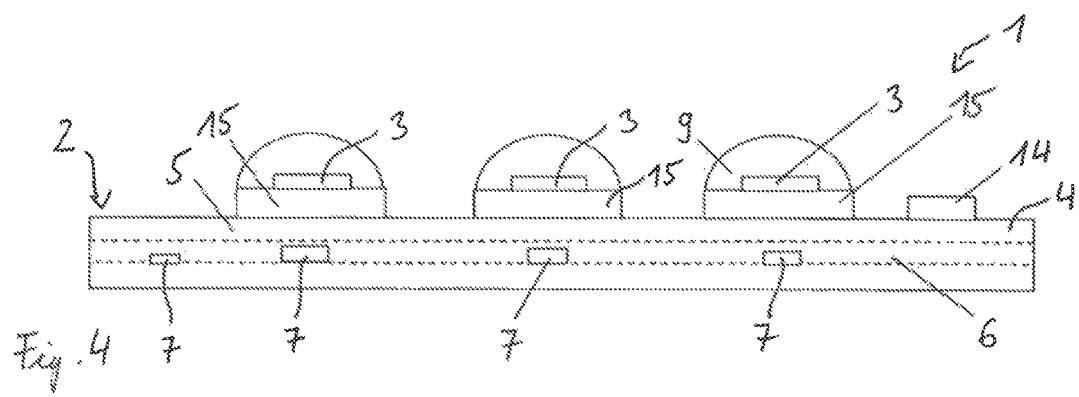

FIG. 4 shows a further embodiment of a light-emitting diode device 1, wherein here a plurality of LEDs 3 are provided, which are in each case arranged on a further carrier 15.

The further carriers 15 are arranged on a common carrier 2. The common carrier 2 comprises polymer layers 4, 5, 6, in which a plurality of electrical components 7 are embedded. Moreover, one or a plurality of further electrical components 14 are arranged on the carrier 2.

The light-emitting diode device 1 can otherwise be designed as described with respect to FIGS. 1 to 3.

Figure 5:
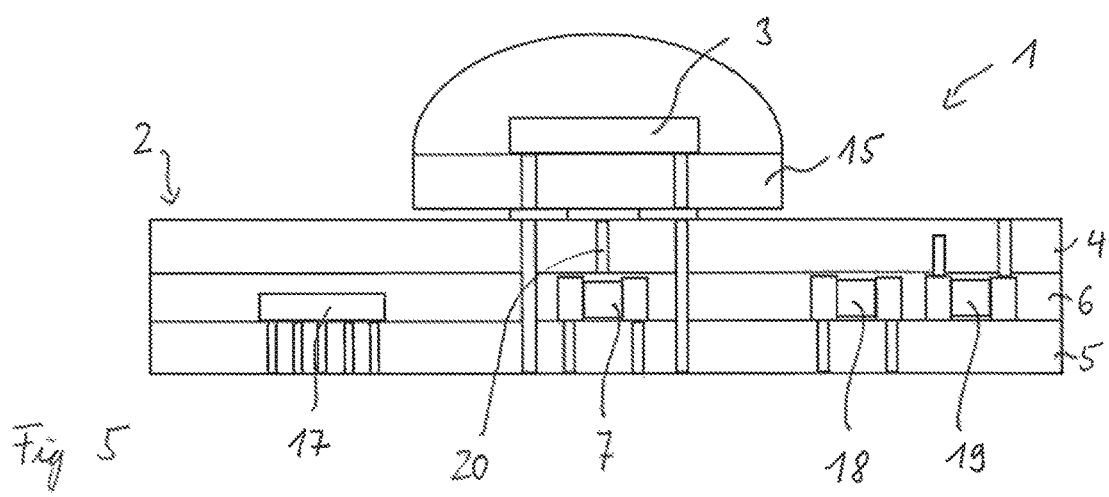

FIG. 5 shows a further embodiment of a light-emitting diode device 1 which is of similar design to the light-emitting diode device 1 from FIG. 3, wherein here a plurality of electrical components 7, 17, 18, 19 are integrated in the carrier 2.

In particular, the components 7, 17, 18, 19 are embedded in one or a plurality of inner polymer layers 6 of the carrier 2. By way of example, all the components 7, 17, 18, 19 are embedded in the same polymer layer 6.

By way of example, one of the electrical components 7 is arranged directly below the LED 3. By way of example, this involves a temperature sensor, in particular an NTC or a PTC thermistor. By way of example, one of the electrical components 17 is designed as a ceramic multilayer capacitor (MLCC), a resistance and/or an inductance. By way of example, one of the electrical components 18 is designed as an ESD protective component, in particular as a multilayer varistor. By way of example, one of the electrical components 19 is designed as an LED driver chip.

Moreover, a metallic via 20 for improving the thermal linking is provided. The metallic via 20 leads through the topmost layer 4 and is arranged directly below the further carrier 15.

The other outer electrode can be connected analogously to a connection contact (not depicted).

The invention claimed is:

1. A light-emitting diode device, comprising at least one carrier and at least one light-emitting diode arranged on the carrier, wherein the carrier comprises a plurality of polymer layers arranged one above another, wherein at least one of the polymer layers has a cutout, wherein an electrical component is embedded in the cutout, wherein the electrical component is arranged in a centered fashion with respect to the light-emitting diode with respect to a lateral direction.

2. The light-emitting diode device according to claim 1, wherein the carrier comprises a topmost, a bottommost and at least one inner polymer layer arranged therebetween, wherein the electrical component is embedded at least in the inner polymer layer.

3. The light-emitting diode device according to claim 1, wherein the electrical component is surrounded by the polymer material of the carrier on all sides.

4. The light-emitting diode device according to claim 3, wherein the component is embedded neither in the topmost nor in the bottommost polymer layer.

5. The light-emitting diode device according to claim 1, comprising at least one through-connection for electrically contacting the electrical component, wherein the through-connection leads through at least one polymer layer.

6. The light-emitting diode device according to claim 1, wherein the electrical component is designed for protection against electrostatic discharges.

7. The light-emitting diode device according to claim 1, wherein the electrical component is designed as a varistor, as a silicon semiconductor protective diode, as a polymer component, as a thermal sensor, as overcurrent protection, as a ceramic multilayer capacitor, as an inductance, as a resistance or as a driver chip.

8. The light-emitting diode device according to claim 1, wherein the polymer layer in which the component is embedded has different material properties than at least one other polymer layer of the carrier.

9. The light-emitting diode device according to claim 8, wherein the polymer layer in which the component is embedded has a different mechanical strength than at least one other polymer layer of the carrier.

10. The light-emitting diode device according to claim 1, wherein the light-emitting diode is at least partly recessed in a cavity in the carrier.

11. The light-emitting diode device according to claim 1, wherein the electrical component is arranged in a centered fashion in the carrier with respect to a stacking direction of the polymer layers.

12. The light-emitting diode device according to claim 1, comprising a plurality of light-emitting diodes arranged on the carrier.

13. The light-emitting diode device according to claim 1, comprising a further carrier, which is arranged on the carrier, wherein the light-emitting diode is arranged on the further carrier.

14. The light-emitting diode device according to claim 1, wherein the further carrier is designed as a ceramic carrier.

15. A light-emitting diode device, comprising at least one carrier and at least one light-emitting diode arranged on the carrier, wherein the carrier comprises a plurality of polymer layers arranged one above another and an electrical component is embedded in at least one of the polymer layers, and wherein the light-emitting diode device further comprises at least two through-connections for electrically connecting the electrical component to connection contacts and at least two further through-connections for electrically connecting the light-emitting diode to the connection contacts, wherein the at least two through-connections are located between the at least two further through-connections.

* * * * *